(12) United States Patent
Yu et al.

(10) Patent No.: US 6,281,559 B1
(45) Date of Patent: Aug. 28, 2001

(54) GATE STACK STRUCTURE FOR VARIABLE THRESHOLD VOLTAGE

(75) Inventors: Bin Yu, Santa Clara; Ercan Adem, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/261,274

(22) Filed: Mar. 3, 1999

(51) Int. Cl.[7] ................................................. H01L 31/119
(52) U.S. Cl. ........................... 257/407; 257/412; 257/616
(58) Field of Search ..................................... 257/369, 407, 257/412, 616

(56) References Cited

U.S. PATENT DOCUMENTS

| | | | |
|---|---|---|---|
| 4,358,326 | * 11/1982 | Doo | 257/756 |
| 5,614,428 | * 3/1997 | Kapoor | 438/301 |
| 5,952,701 | * 9/1999 | Bulucea et al. | 257/369 |

* cited by examiner

*Primary Examiner*—Sara Crane
(74) *Attorney, Agent, or Firm*—Foley & Lardner

(57) ABSTRACT

An ultra-large-scale integrated (ULSI) circuit includes MOSFETs which have different threshold voltages and yet have the same channel characteristics. The MOSFETs include gate structures or gate stacks with a silicon and germanium material provided over a seed layer. The seed layer can be a 20–40 Å polysilicon layer. An amorphous silicon layer is provided over the silicon and germanium material, and a cap layer is provided over the amorphous silicon layer. The polysilicon material is implanted with lower concentrations of germanium, where lower threshold voltage MOSFETs are required. Over a range of 0–60% concentration of germanium, the threshold voltage can be varied by roughly 240 mV.

20 Claims, 17 Drawing Sheets

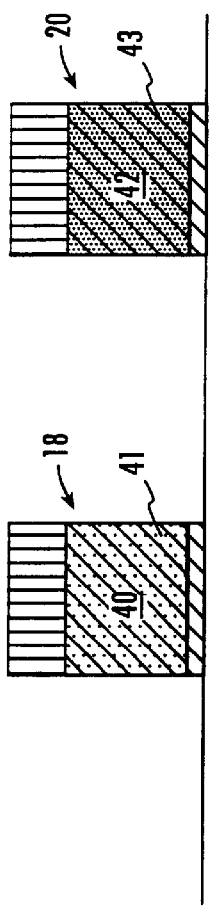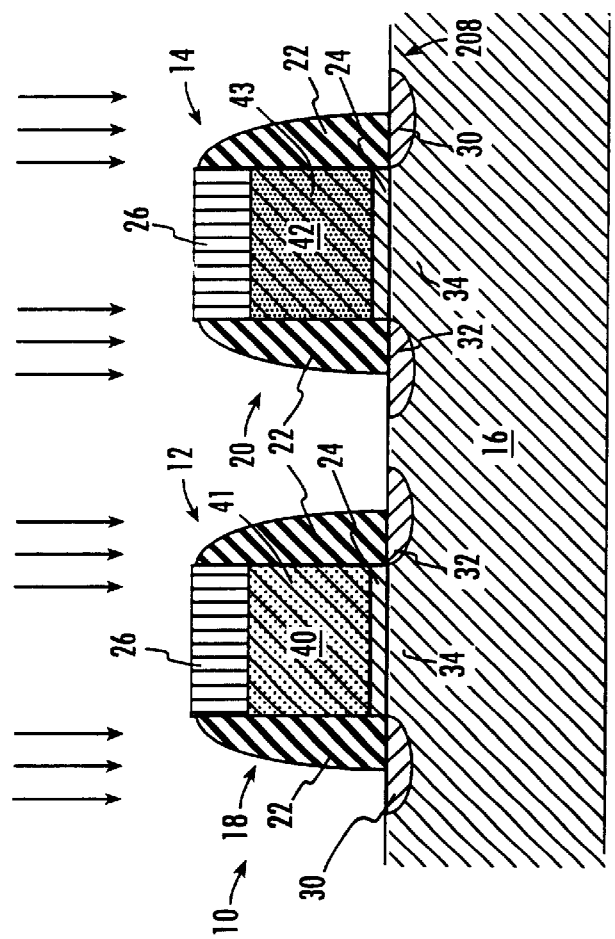

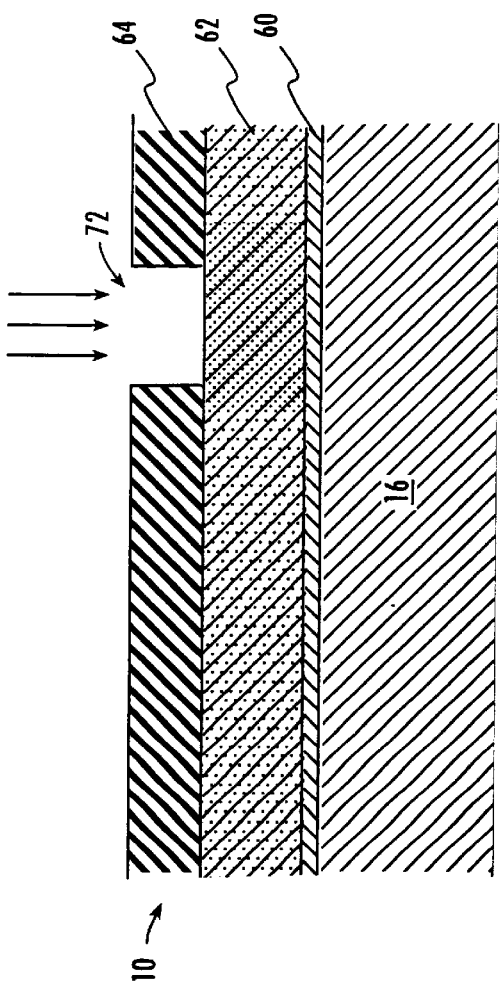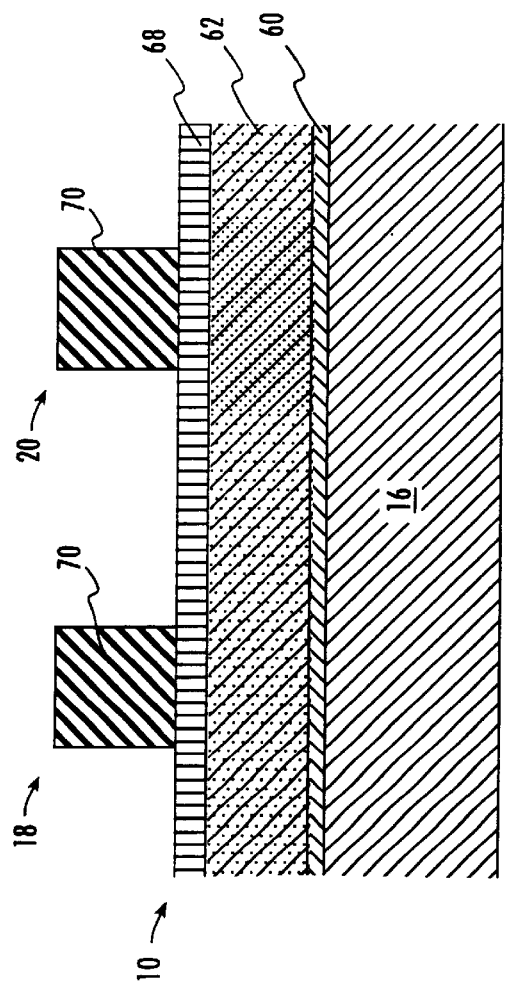

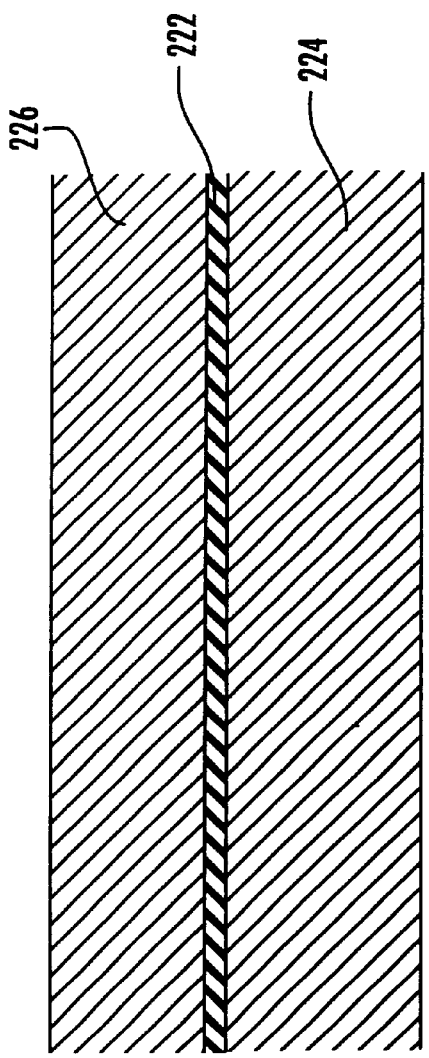
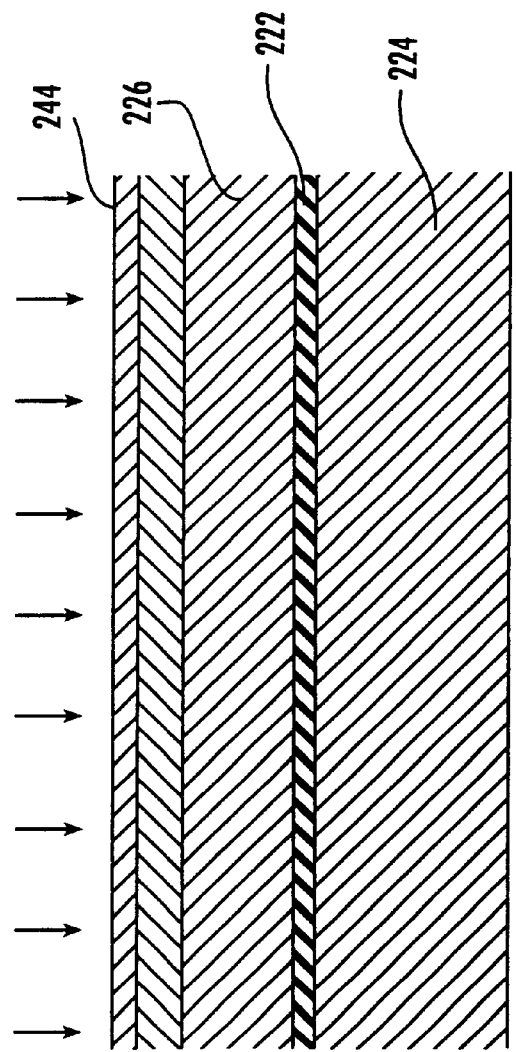

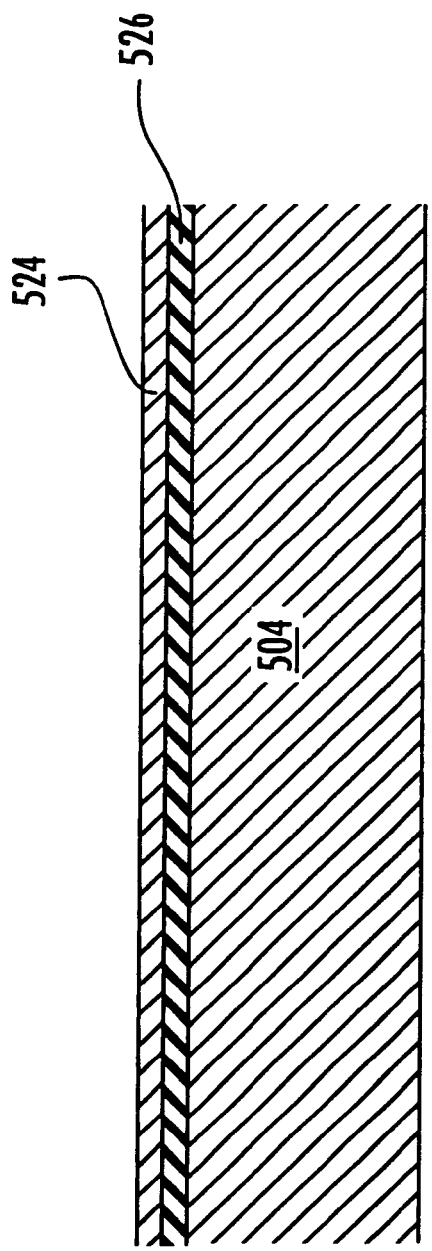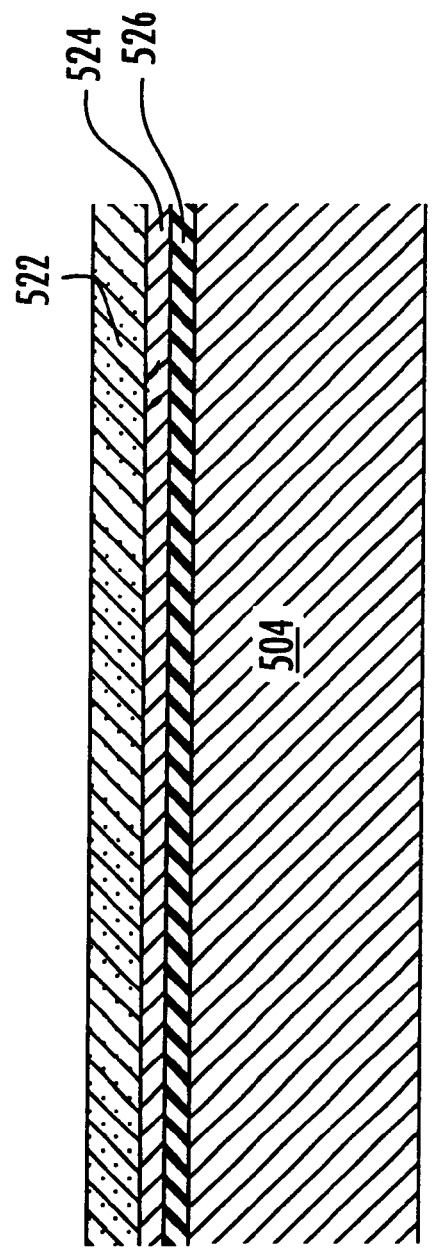

GATE STACK STRUCTURE FOR VARIABLE THRESHOLD VOLTAGE

CROSS REFERENCE TO RELATED APPLICATIONS

This application is related to U.S. patent application Ser. No. 09/187,881, now U.S. Pat. No. 6,127,216 filed on Nov. 6, 1998, by Yu, entitled "Heavily-Doped Polysilicon/Germanium Thin Film Formed by Laser Annealing." This application is also related to U.S. patent application Ser. No. 09/187,842, filed on Nov. 6, 1998, by Yu et al., entitled "Integrated Circuit Having Transistors with Different Multiple Threshold Voltages." This application is further related to U.S. patent application Ser. No. 09/187,618, filed on Nov. 6, 1998, by Yu, entitled "Method of Providing a Gate Conductor with High Dopant Activation." This application is also related to U.S. patent application Ser. No. 09/187,171, now filed U.S. Pat. No. 6,114,206 filed on Nov. 6, 1998, by Yu, entitled "Multiple Threshold Voltage Transistor Implemented by a Damascene Process." This application is still further related to U.S. patent application Ser. No. 09/261,273, now U.S. Pat. No. 6,190,952 filed on the same date herewith, by Yu et al., entitled "Multiple Semiconductor-on-Insulator Threshold Voltage Circuit."

FIELD OF THE INVENTION

The present invention relates generally to an integrated circuit (IC) and the fabrication of an integrated circuit. More particularly, the present invention relates to the formation of a gate stack having a compound semiconductor gate layer.

BACKGROUND OF THE INVENTION

Ultra-large-scale integrated (ULSI) circuits generally include a multitude of transistors, such as, more than one million transistors and even several million or more transistors, that cooperate to perform various functions for an electronic component. Some transistors on the integrated circuit (IC) or chip are part of circuits which perform different operations within other circuits.

Some transistors perform functions for circuits in the critical signal path of the IC, where speed is crucial to the proper operation of the IC. In contrast, other transistors perform functions for circuits in the non-critical signal path of the IC, where speed is not as important. Transistors in the non-critical signal path are preferably designed to consume less power than transistors in the critical signal path. Still other transistors may perform functions for a signal path having a criticality somewhere between the critical signal path and the non-critical signal path and, accordingly, have different speed and power consumption requirements.

Due to smaller off-state current leakage, transistors which have higher threshold voltages (Vth) generally consume less power than transistors which have lower threshold voltages. Threshold voltage refers to the minimum gate voltage necessary for the onset of current flow between the source and the drain of a transistor. Transistors which have lower threshold voltages are faster (e.g., have quicker switching speeds) than transistors which have higher threshold voltages.

In ULSI circuits, transistors, such as, metal oxide semiconductor field effect transistors (MOSFETs) with low threshold voltages, can be used in logic paths which have high speed requirements. In contrast, transistors, such as, MOSFETs with higher threshold voltages, can be used in the non-critical signal path (e.g., storage devices), thereby reducing the off-state leakage current and, hence, reducing the standby power consumption of the entire IC.

ULSI circuits are generally manufactured in accordance with complementary metal oxide semiconductor (CMOS) technology and design criteria which utilize N-channel MOSFETs and P-channel MOSFETs. The N-channel and P-channel MOSFETs generally include a polysilicon gate structure disposed between a drain and a source. The polysilicon gate structure controls charge carriers in a channel region to turn the transistor on and off.

According to conventional designs, threshold voltages for transistors on a single IC are variable by selectively providing channel implants for the transistors. Additional channel implants (e.g., doping the channel region to change the work function difference between the gate and the channel) are used for those transistors with higher threshold voltage requirements (e.g., Vth>0.3V). The transistors which have lower threshold voltage requirements (e.g., Vth$\leq$0.3V) do not receive the additional channel implants.

Utilizing channel implants to adjust the threshold voltages of transistors can be problematic because transistor short-channel performance is very susceptible to process variations. In particular, short-channel performance is extremely sensitive to channel implants or additional doping steps. Accordingly, the modification of the channel with implants can result in significantly different short-channel performance between transistors, which adversely affects the predictability of the design and operability of the IC. This characteristic is particularly problematic as transistors become smaller and packing densities increase. Additionally, providing channel implants adds additional steps to the fabrication process and makes the IC more difficult to manufacture.

Polysilicon/germanium gate conductors are discussed in the above-referenced U.S. patent application Ser. Nos. 09/187,881, 09/187,842, 09/187,618, and 09/187,171. Transistors which utilize polysilicon/germanium gate conductors have significant advantages. The germanium concentration in the gate conductor can be used to adjust the gate work function. Controlling a variable gate work function allows threshold voltages to be adjusted by changing the germanium mole fraction in the gate conductor. This architecture avoids the limitations associated with conventional CMOS processes. Thus, this architecture, which does not rely on changing the channel doping concentration, provides a degree of design freedom over conventional approaches because concerns related to adverse effects on short-channel effects, immunity, channel carrier mobility, and others are reduced.

Further, polysilicon/germanium gate conductors have higher dopant activation rates, as compared with polysilicon gate conductors at the same temperature, and have a greater capability to suppress boron diffusion through thin gate oxides. Higher dopant activation rates allow lower thermal budgets to be utilized in the semiconductor fabrication process. Higher dopant activation rates can also reduce gate sheet resistance and gate depletion effect, which often degrade transistor performance. Boron penetration through the gate oxide can also degrade transistor performance.

In conventional CMOS processes, poor seeding of a polysilicon/germanium film due to large grain size can result when the polysilicon/germanium film is directly deposited on the top surface of the gate oxide. The poor seeding results in a rough surface that can degrade thickness uniformity across the wafer. Additionally, germanium in the gate conductor can be susceptible to outdiffusion away from the gate-oxide interface during high-temperature annealing. Loss of germanium from the gate-oxide interface can cause transistor performance instability. Further still, outgassing/ outdiffusion and oxidation of the germanium in the gate conductor can degrade transistor performance. High concentration of germanium can also adversely affect the quality of silicides that are used to connect local interconnects, contacts, and vias.

Thus, there is a need for an integrated circuit or an electronic device that includes transistors having different threshold voltage levels which can be manufactured according to a simpler process. Further still, there is a need for a ULSI circuit that does not utilize channel implants to adjust threshold voltages among transistors. Even further still, there is a need for a process for fabricating transistors having gate stacks including germanium.

SUMMARY OF THE INVENTION

The present invention relates to a gate stack structure. The gate stack structure includes a gate insulating layer, a thin semiconductor seed layer disposed above the gate insulating layer, a semiconductor layer including germanium disposed above the thin semiconductor seed layer, and an amorphous semiconductor layer. The amorphous semiconductor layer is disposed above the semiconductor layer including germanium.

The present invention further relates to an integrated circuit including a plurality of transistors. The transistors include a gate dielectric, a seed layer disposed above the gate dielectric, and a compound semiconductor layer disposed above the seed layer. The compound semiconductor layer includes first semiconductor atoms and second semiconductor atoms.

The present invention even further still relates to a gate stack including a first type of semiconductor atoms and a second type of semiconductor atoms. The gate stack is manufactured by a method that includes providing a seed layer above a gate layer and providing a semiconductor layer. The semiconductor layer includes the first type of semiconductor atoms and the second type of semiconductor atoms. The semiconductor layer is disposed above the seed layer.

In accordance with an exemplary aspect of the present invention, a seed layer is provided before a polysilicon germanium layer is provided. The seed layer decreases surface roughness (increases film thickness uniformity) across the wafer.

In accordance with another exemplary aspect of the present invention, an amorphous silicon layer is provided over the polysilicon germanium film. The amorphous silicon layer provides a cap that retards germanium outdiffusion and oxidation and provides for higher quality silicidation.

BRIEF DESCRIPTION OF THE DRAWINGS

The present invention will hereafter be described with reference to the accompanying drawings, wherein like numerals denote like elements, and:

FIG. 1 is a cross-sectional view of a portion of an integrated circuit in accordance with an exemplary embodiment of the present invention;

FIG. 2 is a cross-sectional view of the portion of the integrated circuit illustrated in FIG. 1, showing a germanium ion implant step;

FIG. 3 is a cross-sectional view of the portion of the integrated circuit illustrated in FIG. 1, showing a photoresist removal step;

FIG. 4 is a cross-sectional view of the portion of the integrated circuit illustrated in FIG. 1, showing a gate stack formation step;

FIG. 11 is a cross-sectional view of the polysilicon film illustrated in FIG. 10, showing an amorphous silicon deposition step;

FIG. 12 is a cross-sectional view of the polysilicon film illustrated in FIG. 10, showing a dopant implant step;

FIG. 20 is a cross-sectional view of the portion illustrated in FIG. 19, showing a seed layer deposition step;

FIG. 21 is a cross-sectional view of the portion illustrated in FIG. 20, showing a polysilicon/germanium deposition step;

DETAILED DESCRIPTION OF THE PREFERRED EMBODIMENTS

Figure 5:
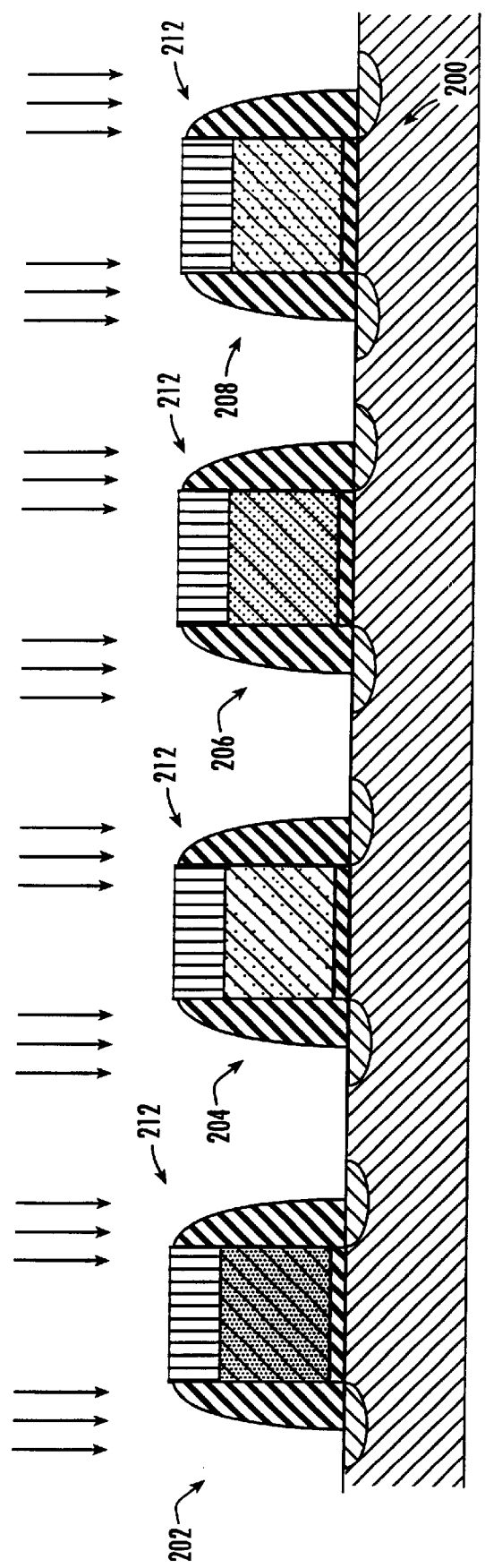
FIG. 5 is a cross-sectional view of a portion of another integrated circuit in accordance with another exemplary embodiment of the present invention.

With reference to FIG. 1, a portion 10 of an integrated circuit (IC) or chip includes a transistor 12 and a second transistor 14. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistors 12 and 14 are disposed on a substrate 16 that is preferably silicon. Transistor 12 includes a gate stack 18, and transistor 14 includes a gate stack 20. Each of gate stack 18 and gate stack 20 includes sidewall spacers 22, a gate dielectric 24, and a protection layer 26. Protection layer 26 is preferably silicon oxynitride (SiON) or silicon nitride material. Spacers 22 and dielectric 24 can be silicon dioxide or other insulating material. Spacers 22 are deposited as a silicon dioxide layer by chemical vapor deposition (CVD), which is selectively etched. Dielectric 24 is thermally grown. Alternatively, spacers 22 can be a nitride material or other insulative material.

Transistors 12 and 14 also both include a drain 30, a source 32, and a channel 34. Channel 34 of transistor 18 has almost identical characteristics to channel 34 of transistor 20. Transistors 18 and 20 are made with the same identical channel implant to avoid short-channel performance degradation. Therefore, additional channel implants are not utilized in the manufacture of portion 10. Transistors 18 and 20 can be N-channel or P-channel transistors.

Gate stack 18 includes a gate conductor 40, and gate stack 20 includes a gate conductor 42. Gate conductors 40 and 42 are preferably manufactured from a semiconductor material, such as, polysilicon, and are doped or implanted with another semiconductor material, such as, germanium. Gate conductors 40 and 42 are also heavily doped with a P-type dopant, such as, boron.

Gate conductor 40 is made from material 41 having a lower concentration of germanium than material 43 of gate conductor 42, as indicated by the lighter shading of gate conductor 40. Consequently, if transistors 12 and 14 are P-channel MOSFETs, transistor 12 has a lower threshold voltage than transistor 14 due to the lower concentration of germanium in material 41. In this case (P-channel), transistor 12 is utilized in a critical signal path and transistor 14 is utilized in a non-critical signal path. However, if transistors 12 and 14 are N-channel transistors, transistor 12 has a higher threshold voltage due to the lower concentration of germanium in material 41. In this case (N-channel), transistor 12 is utilized in a non-critical signal path and transistor 14 is utilized in a critical signal path.

Exemplary values for transistors 12 and 14 (N-channel) are given below. Transistor 12 has a threshold voltage of approximately 0.32 volts, and transistor 14 has a threshold voltage of approximately 0.2 volts. Material 41 of transistor 12 has a concentration of germanium of approximately 10%, and material 43 of transistor 14 has a concentration of germanium of approximately 40%. The difference in the threshold voltage of transistors 12 and 14 is related to the difference in the germanium concentration between materials 41 and 43, where material 41 is $Si_{(1-x)}Ge_x$ and material 43 is $Si_{(1-y)}Ge_y$, x and y representing the molar concentration of Germanium in materials 41 and 43, respectively The threshold voltage is controlled by the work function associated with gate stacks 18 and 20. The work function is related to the fraction of germanium in the polysilicon associated with materials 41 and 43. The germanium composition modifies the valence band level (not the conduction band level) so the work function is decreased (N-channel) as the germanium concentration is increased.

As an example, when transistors 12 and 14 (N-channel) have an identical N-channel implant, and transistor 12 has a 10% molar concentration of germanium in material 41, while transistor 14 has a 40% molar concentration of germanium in material 43, the gate work function associated with transistor 12 is approximately 120 mV greater than that of transistor 14. Therefore, the threshold voltage (Vth) of transistor 12 is 120 mv greater than that of transistor 14. Accordingly, dual-Vth transistors for portion 10 can be designed without changing the channel implant.

Transistors 12 and 14 can be any type of transistor. Most preferably, transistors 12 and 14 are MOSFET transistors and can be either P-channel or N-channel MOSFET transistors. MOSFET transistors 12 and 14 can have threshold voltages ranging from 0.2 volts or less to over 0.7 volts. Preferably, the threshold voltage of transistors 12 and 14 is between approximately 0.2 and 0.4 volts. Isolation and connections between transistors 12 and 14 are not shown in FIGS. 1–5 for simplicity.

Depending upon the concentration of germanium in materials 41 and 43, the threshold voltage value can be changed within a range. For example, from a 0% germanium concentration to a 60% germanium concentration, the threshold voltage can differ by approximately 240 mV, thereby giving a circuit designer a large window within which to select threshold voltages for different paths. Further, the design of transistors 12 and 14 with the advantageous gate structure of the present invention separates the variation of threshold voltages from parameters of the channel, thereby making transistor design simpler and fabrication less complicated.

With reference to FIGS. 1–4, the fabrication of portion 10, including transistors 12 and 14, is described as follows. In FIG. 2, portion 10 includes substrate 16 beneath a gate oxide layer 60 that is beneath a polysilicon/germanium layer 62. Layer 62 is substantially covered with a photoresist layer 64.

Substrate 16 is preferably a silicon substrate, and layer 60 is preferably a gate dielectric layer for dielectric 24 (FIG. 1). Layer 60 can be thermally grown silicon dioxide. Layer 62 is a semiconductor material implanted with another semiconductor material, such as, polysilicon/germanium, $Si_{(1-x)}Ge_x$. Alternatively, the concentration of germanium can be zero (x=0). Layer 62 is exposed to additional germanium ions through an aperture 72 in photoresist layer 64. The region of layer 62 associated with aperture 72 becomes a polysilicon/germanium material doped with more germanium ions, $Si_{(1-y)}Ge_y$, (e.g., material 43 (FIG. 4)), where y is greater than x). Layer 62 is doped or implanted with germanium by an ion implantation technique.

Layer 62 is deposited on top of layer 60 (FIGS. 2 and 3) by chemical vapor deposition (CVD). After deposition, layer 62 can be heavily doped with boron to become a P+ type material and implanted with germanium by the ion implantation process to become material 41 (FIG. 4). Alternatively, layer 62 could be deposited as doped polysilicon with germanium already included. Layer 64 is preferably photoresist, and a photolithographic technique is utilized to define aperture 72. Aperture 72 is preferably as wide or slightly wider than stack 20 (FIG. 1).

With reference to FIG. 3, layer 64 is stripped and a protection layer or barrier layer 68 is deposited over layer 62. Layer 68 can be a silicon oxynitride (SiON) or nitride material. Layer 68 is preferably deposited under low temperature (e.g., approximately 400° C. or less) by CVD.

Layer 68 protects layer 62 for later source and drain implant steps associated with the formation of transistors 12 and 14. Layer 68 also advantageously allows a P+ type gate to be utilized for both N-channel and P-channel MOSFETs. Layer 68 can be doped with boron (P+) when drains 30 and sources 32 are formed for P-channel transistors.

After layer 68 is deposited, a photoresist layer 70 is deposited and selectively etched in accordance with gate stacks 18 and 20. Portion 10 is plasma-etched or dry-etched to form gate stacks 18 and 20 (FIG. 1 and FIG. 4). In FIG. 4, after etching, layer 70 is removed. Gate stack 18 includes material 41, and gate stack 20 includes material 43. Gate stacks 18 and 20 can be formed by a variety of fabrication techniques. With reference to FIG. 1, conventional transistor processes can be utilized to form drains 30 and sources 32, contacts, isolation and interconnectors for portion 10.

Alternatively, conductors 40 and 42 could be doped in accordance with an amorphous silicon process, as discussed below with reference to FIGS. 6–9, where a germanium layer is provided on top of a silicon layer. The germanium and silicon layers are subjected to an amorphization process and melted to form conductors 40 and 42 as polysilicon material doped with germanium. In yet another alternative, conductors 40 and 42 can be formed in a damascene process, as discussed below with reference to FIGS. 15–18. In this process, dummy polysilicon conductors are removed and replaced with polysilicon conductors that are selectively doped with germanium.

With reference to FIG. 5, a portion 200 of an IC includes transistors 202, 204, 206 and 208 (N-channel or P-channel), which are fabricated in accordance with a similar process described with reference to FIGS. 1–4. Assuming transistors 202, 204, 206, and 208 are N-channel devices, the threshold voltage associated with transistor 202 is lower than the threshold voltages of transistors 204, 206 and 208. The threshold voltage of transistor 204 is higher than the threshold voltages of transistors 206 and 208. Transistor 208 has a higher threshold voltage than transistor 206. Thus, portion 200 includes transistors having four different threshold voltages. Threshold voltages of transistors 202, 204, 206, and 208 are controlled by the amount of germanium concentration in gate structures 212 associated with transistors 202, 204, 206, and 208. Unlike the process described in FIGS. 1–4, several germanium implantation steps are necessary to appropriately implant gates 212. The implant steps require several photoresist masks to appropriately provide the correct concentrations of germanium in gates 212.

Figure 6:
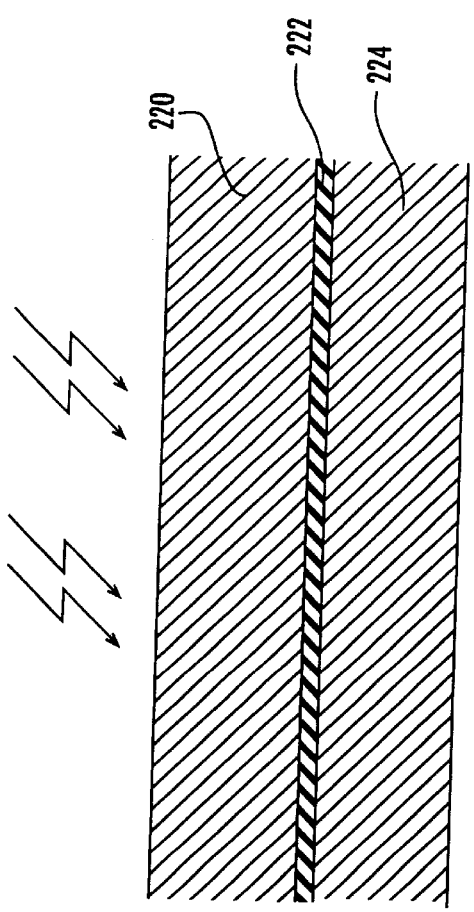
FIG. 6 is a cross-sectional view of a polysilicon/ germanium film in accordance with yet another exemplary embodiment of the present invention; the polysilicon/ germanium film can be utilized in the portion of the integrated circuit illustrated in FIG. 1.

With reference to FIG. 6, a polysilicon/germanium film 220 can be utilized on portion 10 (FIG. 1) and portion 200 (FIG. 5) as a gate-conducting material, such as, materials 41 and 43. Film 220 is provided over a gate oxide layer 222 that is provided over a silicon substrate 224.

Film 220 is preferably a heavily doped polysilicon/germanium film that can be doped with N-type dopants or P-type dopants. Additionally, film 220 preferably has a box-like dopant profile, as will be described hereinafter, and is preferably a $Si_{(1-x)}Ge_x$ material.

Figure 7:
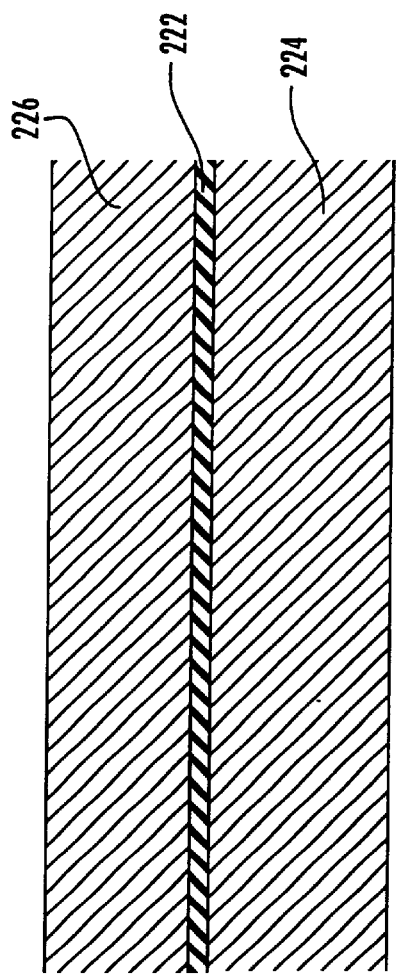
FIG. 7 is a cross-sectional view of the polysilicon/ germanium film illustrated in FIG. 6, showing an amorphous silicon deposition step.

With reference to FIGS. 6–9, the manufacture of film 220 is described as follows. In FIG. 7, an amorphous silicon layer 226 is deposited by low pressure chemical vapor deposition (LPCVD) on top of layer 222. Layer 226 is preferably between 100 nm and 200 nm thick and is deposited at a temperature below 500° C. Layer 226 has a smaller crystal size than film 220 (FIG. 6). Layer 222 can be a 2–4 nm thick oxide layer, a 30 to 50 nm thick nitride layer, or other dielectric layer.

Figure 8:
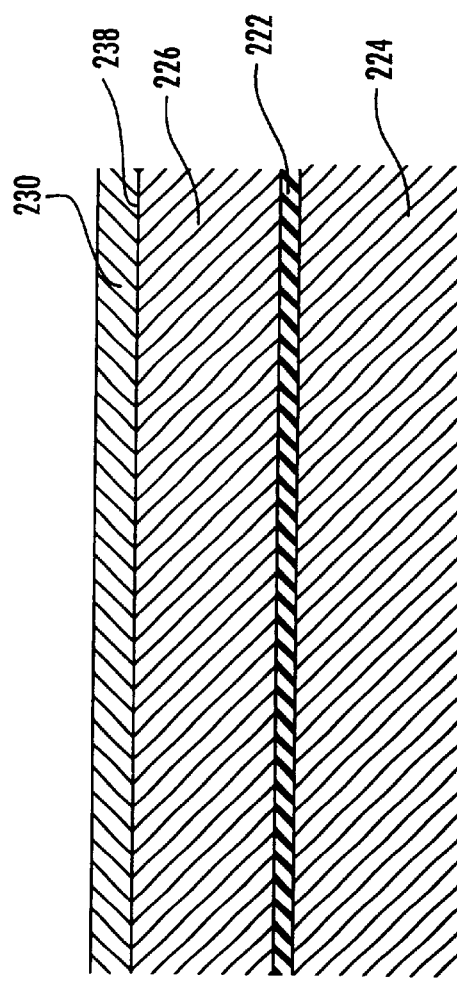
FIG. 8 is a cross-sectional view of the polysilicon/ germanium film illustrated in FIG. 6, showing an amorphous germanium deposition step film.

With reference to FIG. 8, an amorphous germanium layer 230 is deposited by LPCVD over a top surface 238 of layer 226. Layer 230 is preferably a thin layer of amorphous germanium deposited at a temperature below 500° C. Preferably, layer 230 is between 10 and 20 percent of the thickness of layer 226 (e.g., between 10 and 40 um). The thickness of layers 226 and 230 can be dependent upon the desired composition of film 220 (e.g., the value for x). Accurate control of germanium concentration can be obtained by adjusting the thickness ratio between layers 226 and 230.

Figure 9:
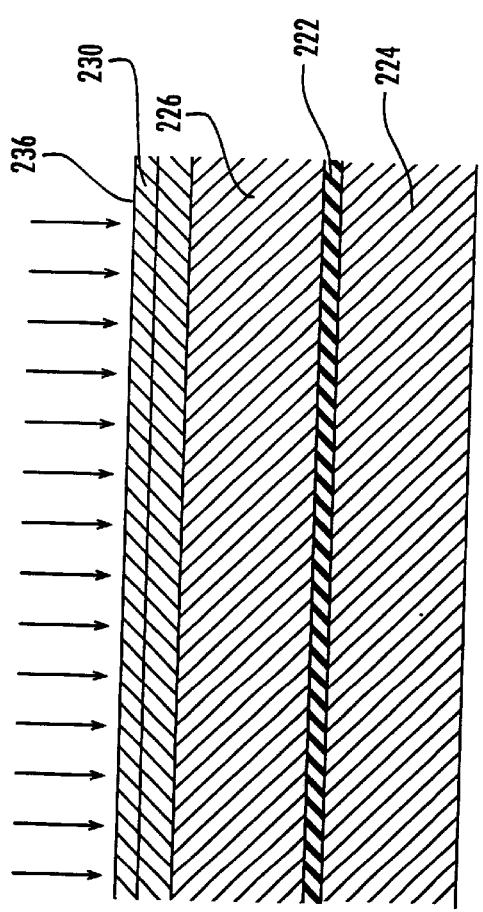
FIG. 9 is a cross-sectional view of the polysilicon/ germanium film illustrated in FIG. 6, showing a dopant implant step.

With reference to FIG. 9, layers 226 and 230 are subjected to a dopant implant. A dopant, such as, arsenic, phosphorus, boron, or boron difluoride ($BF_2$), can be implanted about surface 238 (FIG. 8). Preferably, the implant is performed under small implant energy so the projection is relatively shallow below a top surface 236 of layer 230. Multiple implants using different types of dopants can be utilized to increase the dopant concentration within layers 226 and 230, until a level close to the solid solubility limit of layers 226 and 230 is reached. The dopants are preferably implanted in an ion implantation process, wherein the peak of the dopant concentration is centered at approximately one-quarter of the thickness of the combination of layers 226 and 230 (e.g., below surface 236 by 25–50 nm). The implant is sufficiently shallow to avoid significant dopant tail effect into layer 222.

With reference to FIG. 6, layers 226 and 230 (FIG. 9) are subjected to an excimer laser-annealing process to melt layers 226 and 230. During the laser annealing, dopants diffuse evenly throughout film 220 in a box-like profile. The laser-annealing process also electrically activates dopants in layers 226 and 230 (FIG. 9) at the same time. The excimer laser-annealing process preferably heats layers 226 and 230 above the melting point of amorphous silicon (e.g., 900° C.). Preferably, annealing provides a local temperature above the melting point of amorphous germanium (between approximately 950° C. and 1000° C.).

After the laser-annealing step, film 220 is recrystallized as polysilicon with electrically activated impurities. The excimer laser-annealing process activates the dopants more quickly than conventional thermal-annealing processes. Alternatively, other annealing, thermal, or heating processes can be utilized to activate and diffuse dopants.

The method discussed with reference to FIGS. 6–9 advantageously provides a uniform dopant and germanium profile in film 220. Unlike conventional processes, in which the dopant distribution and the gate material has a Gaussian-like profile, and the physical dopant concentration near the gate electrode/gate oxide interface is relatively low, film 220 obtains a uniform box-like. dopant profile. The evenly distributed germanium profile in film 220 is independent of subsequent thermal steps. A stable germanium composition near the gate/oxide interface (interface between gate oxide layer 222 and film 220) is advantageously achieved and gate-depletion effect is minimized.

Figure 10:
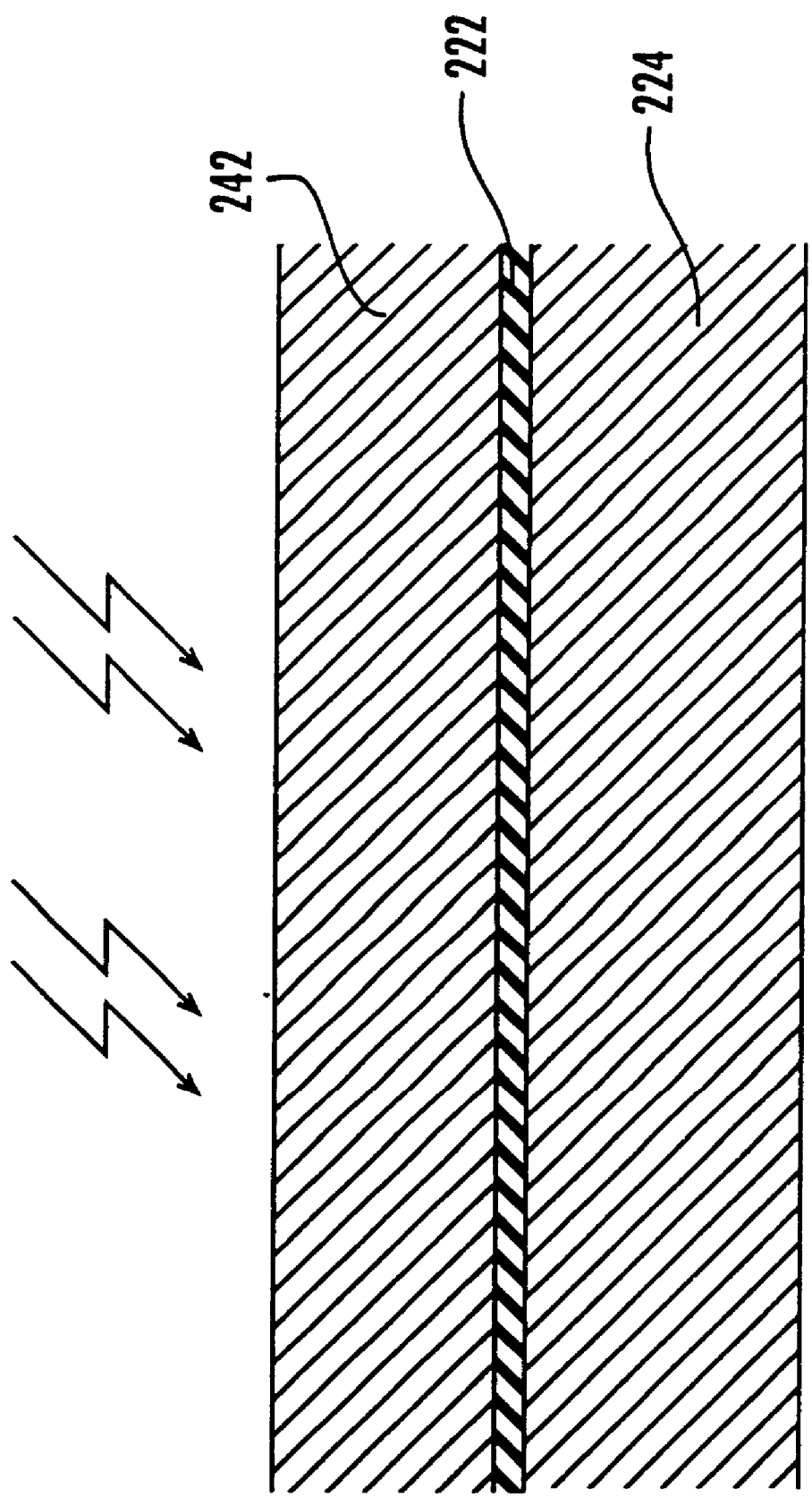
FIG. 10 is a cross-sectional view of a polysilicon film in accordance with still another exemplary embodiment of the present invention; the polysilicon film can be utilized in the portion of the integrated circuit illustrated in FIG. 1.

With reference to FIG. 10, a polysilicon film 242 similar to polysilicon/germanium film 220 is discussed. Film 242 can be manufactured in a process similar to the process used to manufacture film 220. However, film 242 does not include germanium. Film 242 is provided on layer 222, which is provided on substrate 224. Film 242 has a box-like profile of evenly diffused dopant. Film 242 can be utilized in portion 10 or portion 200, discussed with reference to FIGS. 1 and 5.

The manufacture of film 242 is discussed below with reference to FIGS. 10–12. In FIG. 11, an amorphous silicon layer 226 is deposited by LPCVD on top of layer 222. Layer 226 is preferably 100 nm–200 nm thick and is deposited at a temperature below 500° C.

In FIG. 12, layer 226 receives a dopant implant. The dopant implant is preferably provided at a shallow projection. Multiple implants can be utilized to increase the dopant concentration until layer 226 is close to its solid solubility limit. The dopant concentration of the dopant implant is centered at approximately one-quarter of the thickness of layer 226, below a top surface 244 or may alternatively be centered at approximately one-half of the thickness of layer 226. The dopant implant is sufficiently shallow to avoid dopant tail effect into layer 222 (approximately 25 to 50 nm below surface 244).

With further reference to FIG. 10, layer 242 is subject to excimer laser-annealing to melt layer 242. The excimer laser-annealing diffuses dopant evenly through film 242 in a box-like profile. The excimer laser-annealing preferably provides a local temperature between 900° C. and 1000° C. for film 242, thereby activating electrically-activated dopants. Film 242 is recrystallized as polysilicon after heating. Alternatively, films 220 (FIG. 6 embodiment) and 242 could be heated by other processes to activate dopants and recrystalize films 220 and 242.

Figure 13:
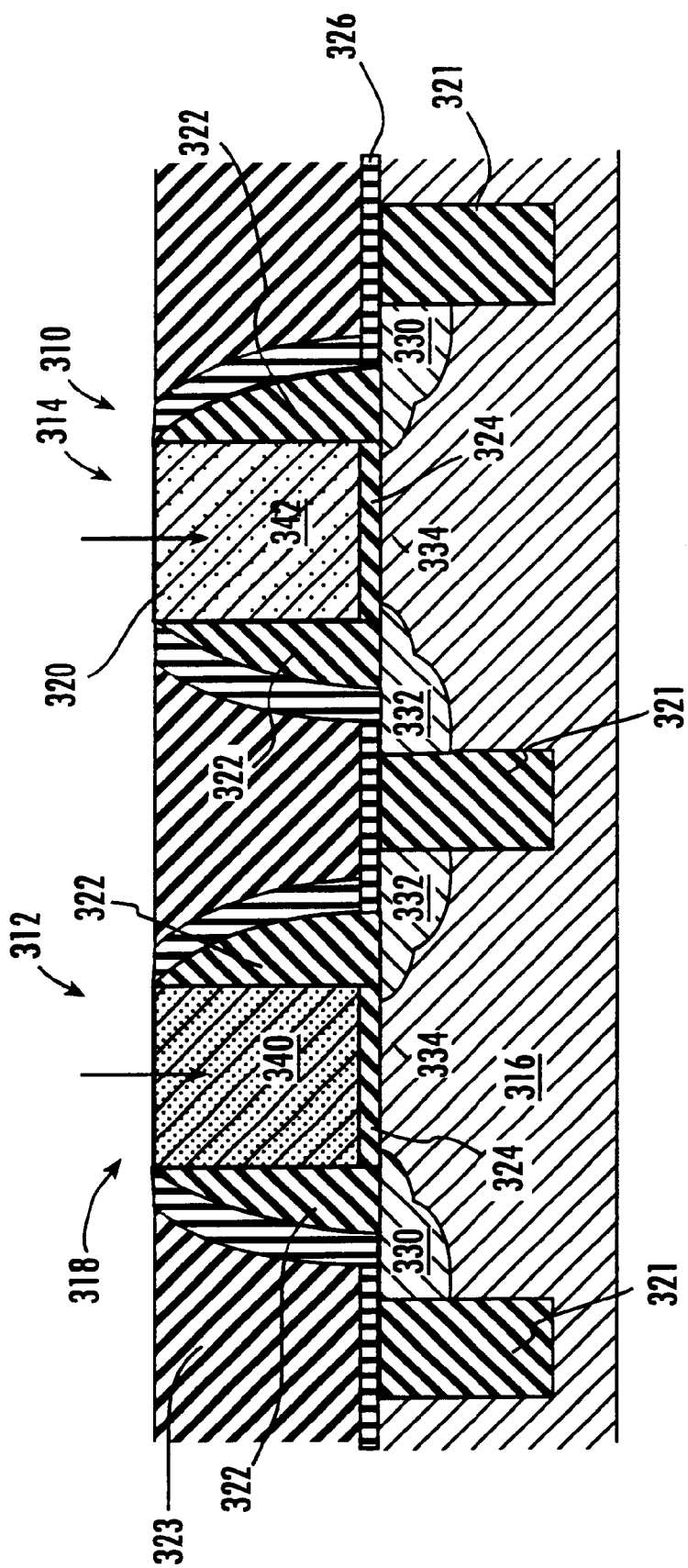
FIG. 13 is a cross-sectional view of a portion of yet another integrated circuit in accordance with still another exemplary embodiment of the present invention.

With reference to FIG. 13, a portion 310 of an IC or chip includes a transistor 312 and a transistor 314. Portion 310 is preferably part of an ULSI circuit and can be similar to portion 10 (FIG. 1).

Transistors 312 and 314 are disposed on a substrate 316 that is preferably silicon. Transistor 312 includes a gate stack 318, and transistor 314 includes a gate stack 320. Each of gate stack 318 and gate stack 320 includes sidewall spacers 322, a gate dielectric 324, and a protection layer 326. Protection layer 326 is preferably a $SiO_xN_y$ layer that is utilized as a polish stopper. An insulative layer 323 is deposited over protection layer 326. Layer 323 can be silicon dioxide deposited in a tetraorthosilicate (TEOS) process.

Transistors 312 and 314 both include a drain 330, a source 332, and a channel 334. Channel 334 of transistor 312 has almost identical characteristics to channel 334 of transistor 314. Transistors 312 and 314 are made with an identical or substantially identical channel implant to avoid short-channel performance degradation and can be similar to transistors 12 and 14 (FIG. 1). Transistors 312 and 314 are separated by shallow isolation trenches 321.

Gate stack 318 includes a gate conductor 340, and gate stack 320 includes a gate conductor 342. Gate conductors 340 and 342 are preferably manufactured from a semiconductor material, such as, polysilicon, and are both implanted with another semiconductor material, such as, germanium. Gate conductors 340 and 342 are also heavily doped with a P-type dopant, such as, boron. Gate conductor 340 has a higher concentration of germanium than gate conductor 342, as indicated by the darker shading of gate conductor 340.

Consequently, if transistors 312 and 314 are P-channel MOSFETs, transistor 314 has a lower threshold voltage than transistor 312 due to the lower concentration of germanium in conductor 342. If transistors 312 and 314 are N-channel transistors, transistor 314 has a higher threshold voltage due to the higher concentration of germanium in conductor 340. Transistors 312 and 314 can have similar exemplary values as described with reference to transistors 12 and 14 in FIGS. 1–5.

Figure 14:
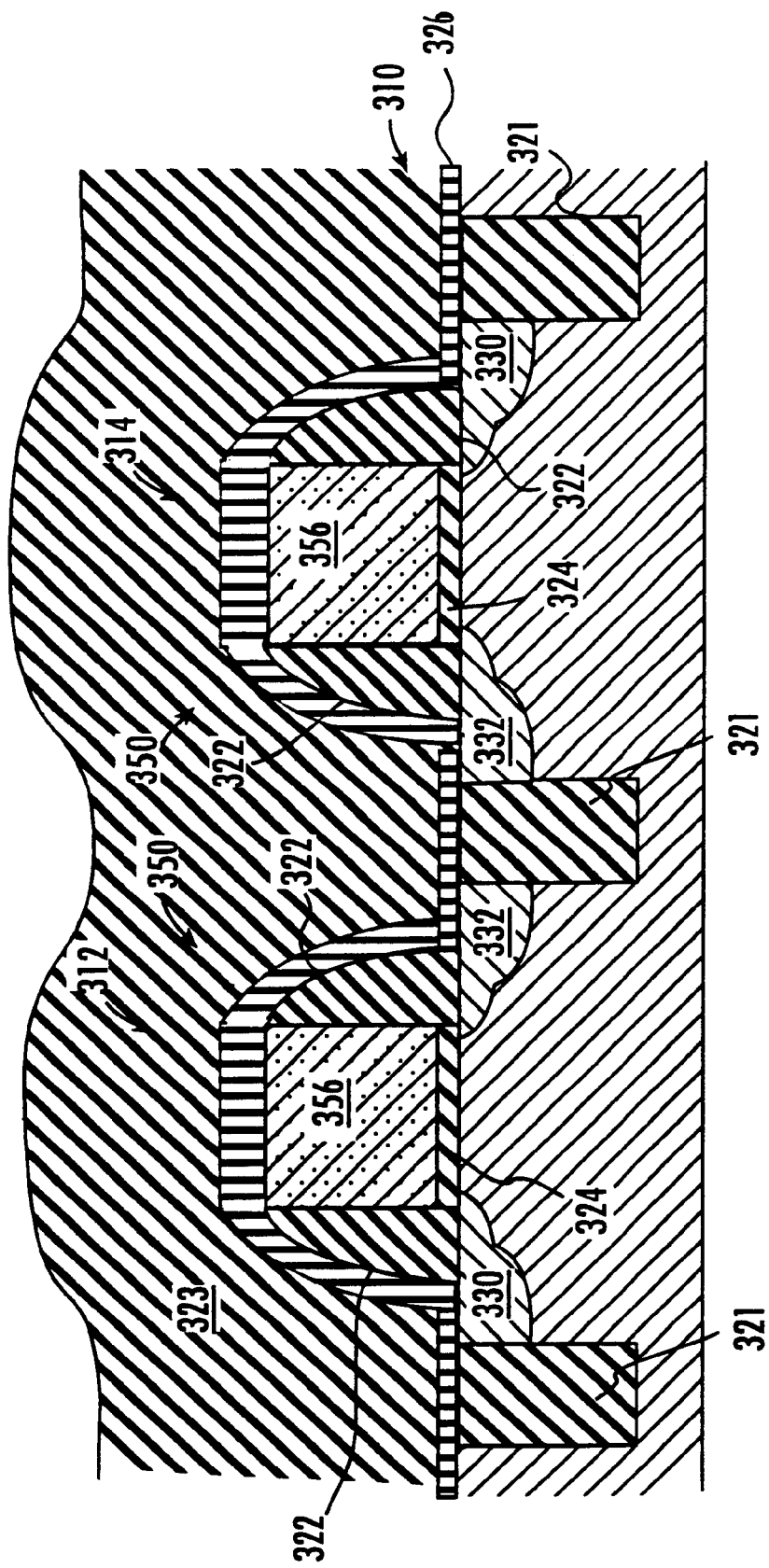
FIG. 14 is a cross-sectional view of the portion of the integrated circuit illustrated in FIG. 13, showing dummy gate structures.

With reference to FIGS. 13–18, the fabrication of portion 310, including transistors 312 and 314, is described as follows. In FIG. 14, portion 310 includes transistors 312 and 314 having dummy gate structures or stacks 350. The damascene process allows a self-aligned technique to be utilized because sources 332 and drains 330 are formed with stacks 350. Dummy gate stacks 350 include an undoped polysilicon material 356, dielectric 324, and spacers 322. Alternatively, material 356 can be other types of semiconductor materials. Stacks 350 are partially covered by a barrier or protection layer 326 made of siliconoxynitride ($SiO_xN_y$), which is overcoated by insulative layer 323. Layer 323 can be an oxide layer. Transistors 312 and 314, including stacks 350, can be fabricated according to conventional processes.

Figure 15:
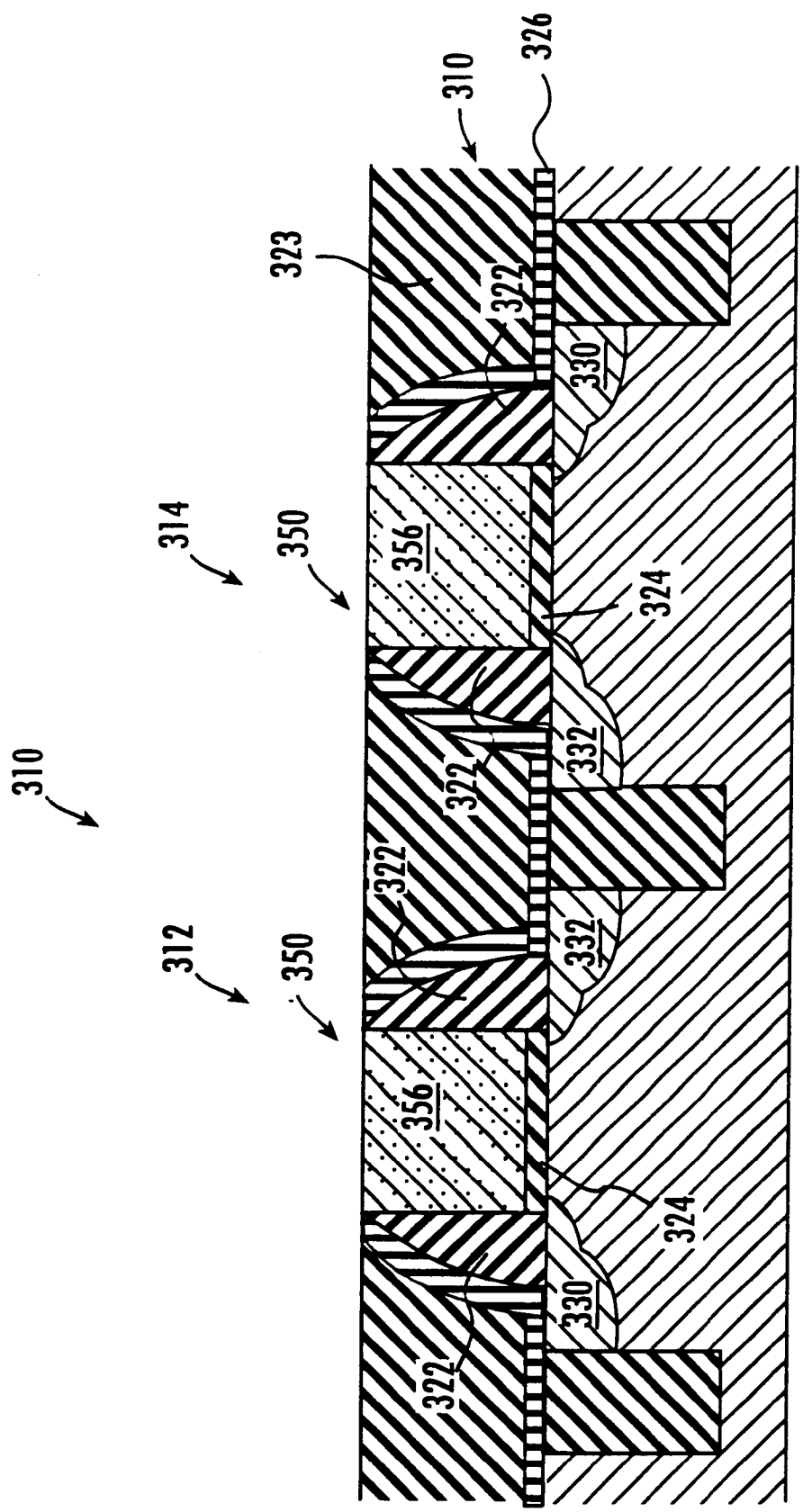
FIG. 15 is a cross-sectional view of the portion of the integrated circuit illustrated in FIG. 13, showing a chemical-mechanical polish (CMP) step.
Figure 16:
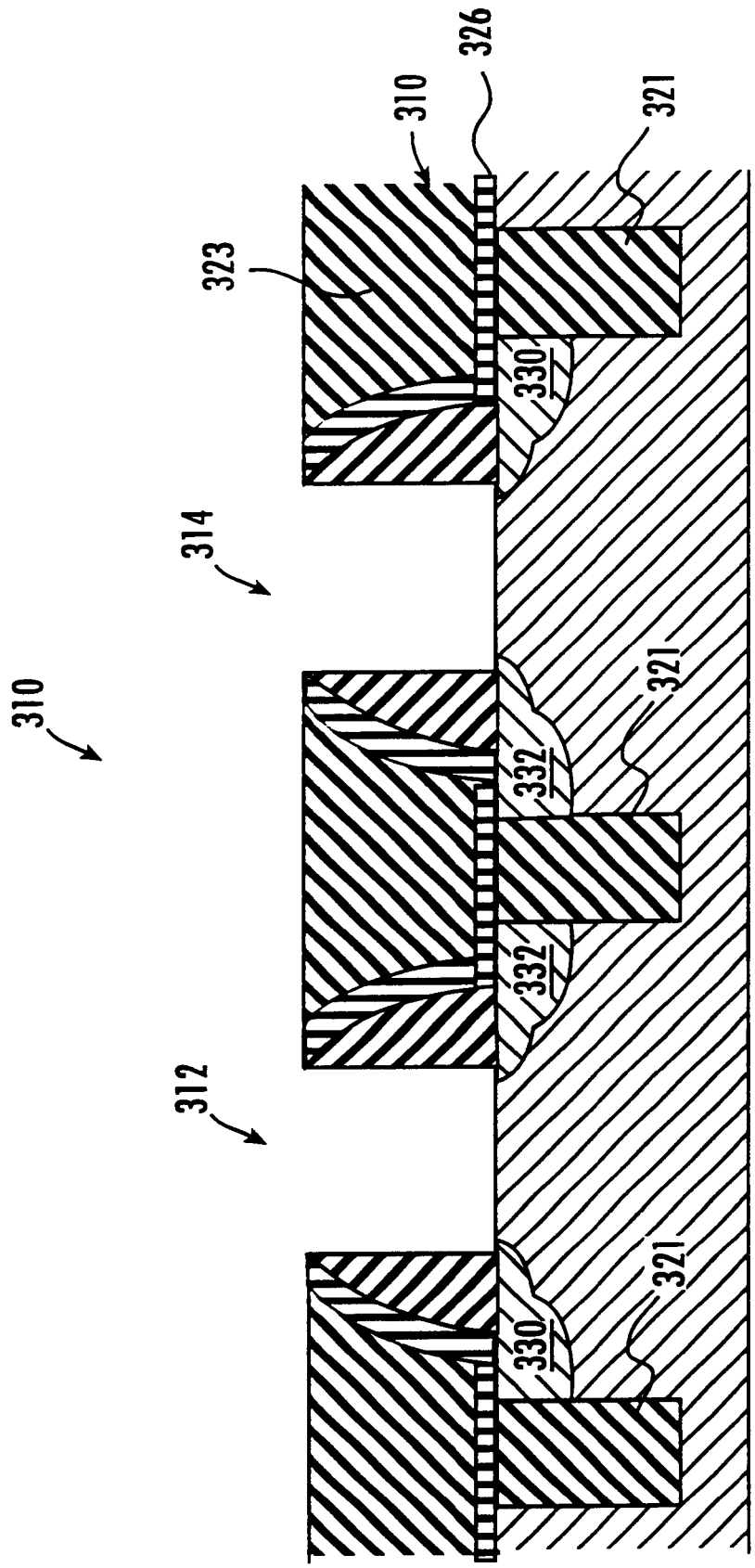
FIG. 16 is a cross-sectional view of the portion of the integrated circuit illustrated in FIG. 13, showing a wet-etching step.
Figure 17:
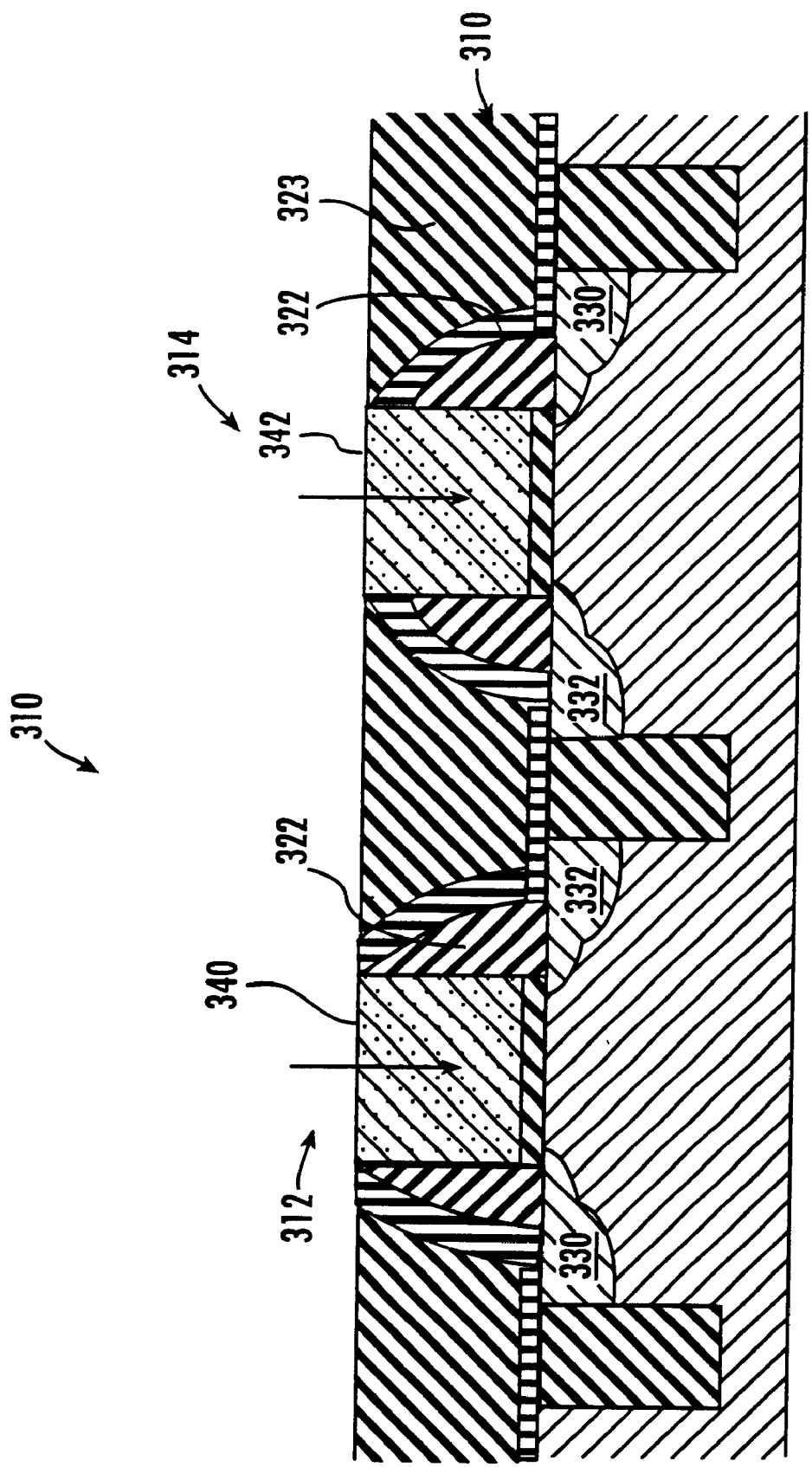
FIG. 17 is a cross-sectional view of the portion of the integrated circuit illustrated in FIG. 13, showing a refill step.

In FIG. 15, portion 310 is subject to a chemical-mechanical polish (CMP) to remove a portion of insulative layer 323. Portion 310 is subject to the CMP until layer 326 is removed from the top of dummy stacks 350. In FIG. 16, polysilicon material 356 is removed by wet-etching selective to polysilicon. Alternatively, dry-etching or other stripping techniques can be utilized to remove polysilicon material 356 from dummy stacks 350. In FIG. 17, gate conductors 340 and 342 are provided in-situ for transistors 312 and 314, respectively. Preferably, P+-type doped polysilicon/ germanium is deposited and etched back to leave a form of conductors 340 and 342 between spacers 322. Alternatively, polysilicon can be deposited and implanted with germanium.

Figure 18:
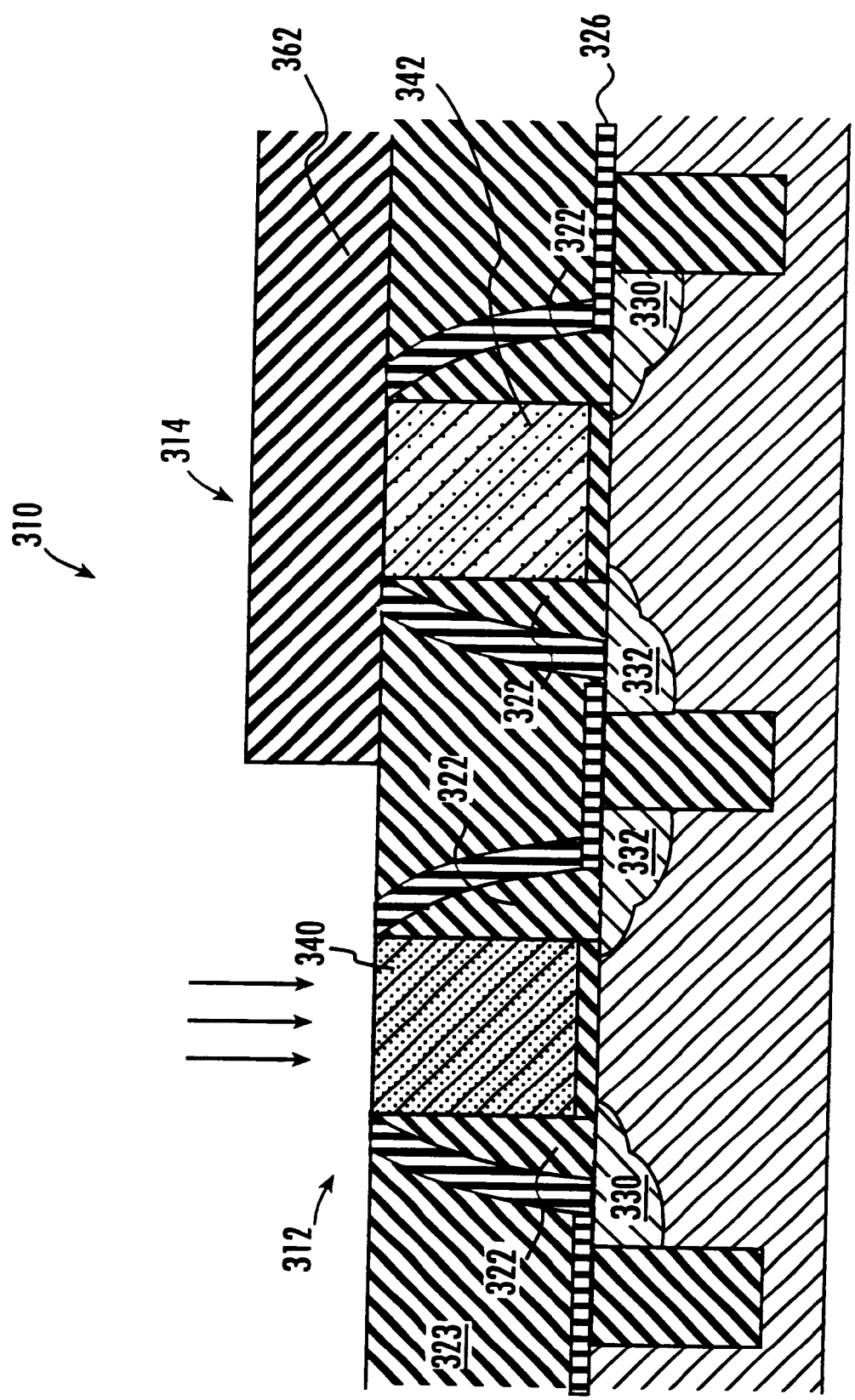
FIG. 18 is a cross-sectional view of the portion of the integrated circuit illustrated in FIG. 13, showing a germanium implantation step.

With reference to FIG. 18, transistor 314 is covered by a photoresist layer 362. After transistor 314 is covered, gate conductor 340 associated with transistor 312 is implanted with germanium ions to a concentration so that conductor 340 is composed of a $Si_{(1-y)}Ge_y$ material, and conductor 342 is composed of a $Si_{(1-x)}Ge_x$ material, where y is greater than x. Alternatively, in FIG. 17, conductors 340 and 342 can be provided as undoped polysilicon and doped in subsequent steps. Additionally, in FIG. 18, a photoresist layer similar to layer 362 can be provided over transistor 314 and ion (e.g., germanium) implantation can be provided to conductor 342. In still further alternatives, conductors 340 and 342 can be provided as films 220 and 242 (FIG. 6 and FIG. 10, respectively).

With reference to FIGS. 19–24, a process for forming an advantageous gate stack including two semiconductor materials is described. The gate stack can be utilized in any of the transistors described with reference to FIGS. 1–5 or 13–18. For example, the gate stack is particularly advantageous in forming transistors 12 and 14 discussed with reference to FIGS. 1–5. In addition, the process described below can utilize some of the steps related to germanium concentration and gate stack formation, described with reference to FIGS. 1–18, without departing from the scope of the present invention.

Figure 19:
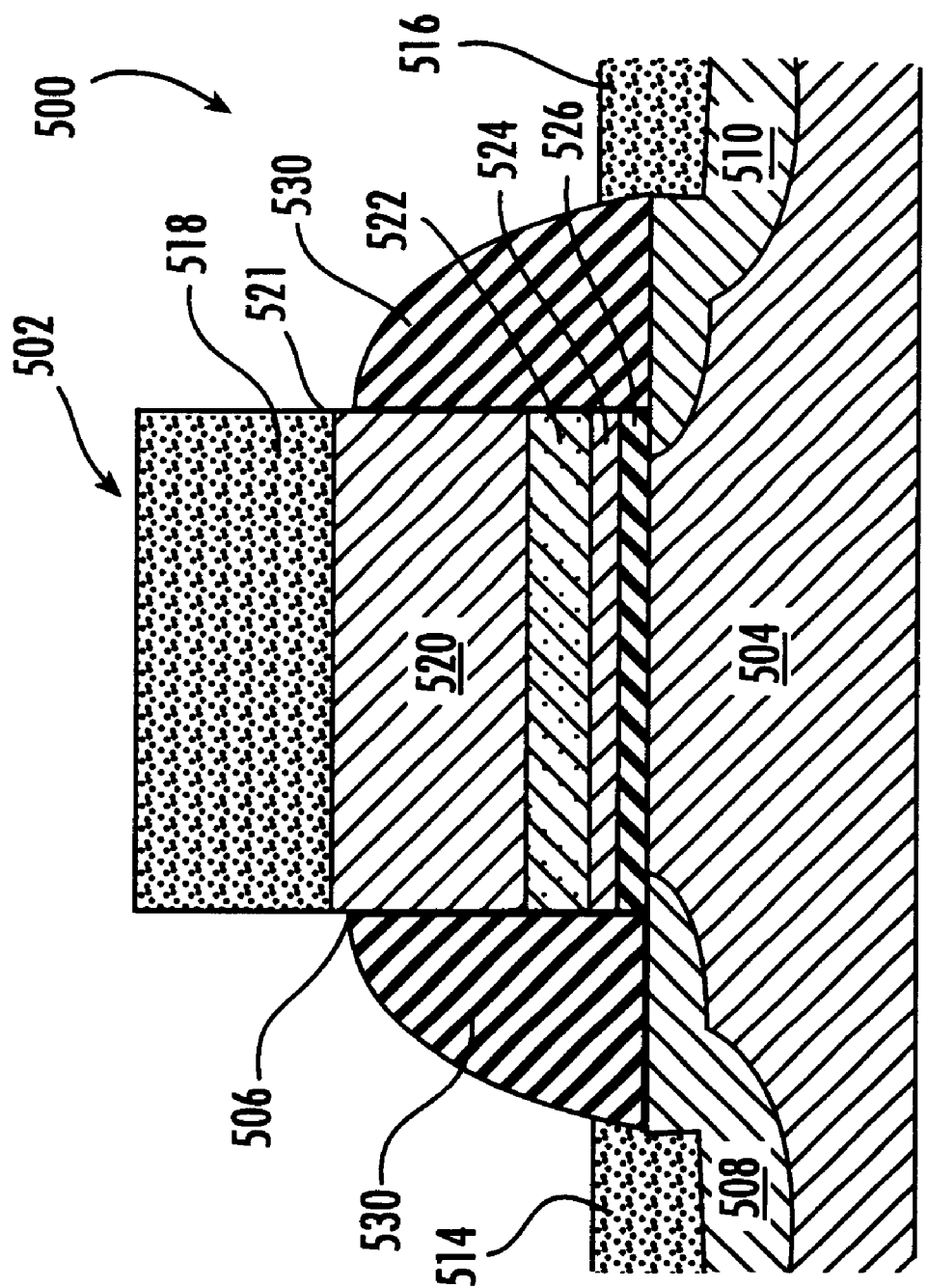
FIG. 19 is a cross-sectional view of a portion of a transistor of an integrated circuit including a gate stack in accordance with an even further exemplary embodiment of the present invention.

With reference to FIG. 19, an N-channel or P-channel transistor 502 is disposed on a portion 500 of a semiconductor substrate 504. Transistor 502 is preferably a MOSFET and includes a gate stack 506, a source 508, and a drain 510. Source 508 is electrically coupled to a silicide layer 514, and drain 510 is coupled to a silicide layer 516. Gate stack 506 is coupled to a silicide layer 518. Layers 514, 516, and 518 are preferably cobalt silicide.

Gate stack 506 includes an amorphous semiconductor layer 520, a compound semiconductor layer 522, a seed layer 524, and a dielectric layer 526. Additionally, dielectric spacers 530 are provided on each side of gate stack 506.

Seed layer 524 has a small grain size and is preferably a 20–40 Å thick layer of polysilicon. Seed layer 524 is a very thin polysilicon layer that improves the deposition of layer 522 and contributes to superior surface uniformity (less surface roughness). Since layer 524 is only 20–40 Å thick, it does not significantly impact the work function of gate stack 506. The work function of gate stack 506 is determined by the concentration of germanium in layer 522. Preferably, transistor 502 has a threshold voltage between 0.2V and 0.3V.

Compound semiconductor layer 522 is preferably a polysilicon/germanium thin film layer. Compound layer 522 can have a thickness of 200–400 Å and can have a concentration of germanium from 0 to approximately 40 percent. Amorphous semiconductor layer 520 is preferably an amorphous silicon layer having a thickness of 500–550 Å. Dielectric layer 526 can be a thermally grown silicon dioxide layer that is 20–50 Å thick. Alternatively, a silicon oxide nitride (SiON) or nitride material can be deposited.

Transistor 502 could be utilized on portion 10 (FIG. 1) or portion 200 (FIG. 5) as one of transistors 12 and 14 or as one of transistors 202, 204, 206, and 208, respectively. The germanium concentration in gate stack 506 can be controlled in a variety of fashions, as described hereinabove.

With reference to FIGS. 19–24, a process for forming gate stack 506 is described as follows. In FIG. 20, after layer 526 is thermally grown on substrate 504, seed layer 524 is deposited as a very thin 20–40 Å thick undoped polysilicon layer on layer 526. Substrate 504 is preferably a silicon material that is part of a wafer. Any effect that seed layer 524 has on the work function of transistor 502 can be compensated for by various techniques. Such techniques include adjusting the germanium concentration in layer 522 as well as adjusting doping concentrations.

Layer 524 is deposited on layer 526 in a low pressure chemical vapor deposition (LPCVD) process. The LPCVD process occurs in a chamber. Preferably, the temperature in the chamber is approximately 600–625° C., and a gas of silane (SiH$_4$) is used for deposition or growth of layer 524.

In FIG. 21, while substrate 504 is in the same chamber which was utilized to deposit layer 524, an undoped polysilicon/germanium (Si$_x$Ge$_{(1-x)}$ where x is the concentration of silicon) thin film is deposited as layer 522 by LPCVD. A gas of GeH$_4$ (germane) is provided with the silane gas to form the polysilicon/germanium thin film of layer 522. The composition of germanium in layer 522 is controlled by the gas ratio between the silane and germanium hydride. Preferably, layer 522 is deposited at a temperature between 600–650° C., and the thickness of layer 522 is between 200–400 Å.

Figure 22:
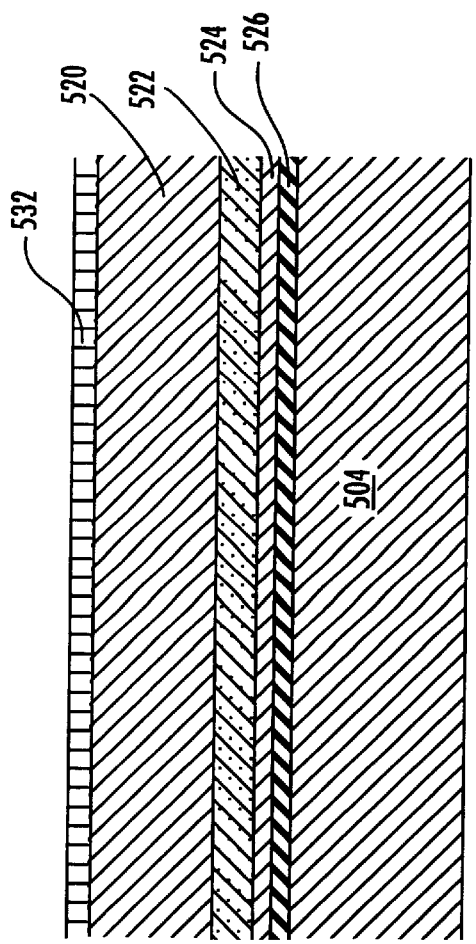
FIG. 22 is a cross-sectional view of the portion illustrated in FIG. 21, showing an amorphous silicon deposition step.

With reference to FIG. 22, amorphous semiconductor layer 520 is deposited in the same chamber utilized to deposit layer 522. An LPCVD technique can be utilized to deposit an amorphous silicon layer as layer 520 at a temperature of 500–550° C. and a thickness of about 500–1500 Å. According to one embodiment, the gas of germane for layer 522 is turned off, and the temperature in the chamber is lowered to 500–550° C. to deposit layer 520. Layer 520 is deposited using silane gas.

Layer 520 retards germanium outdiffusion, thereby increasing device stability. Additionally, layer 520 prevents outgassing and oxidizing of germanium. Further, layer 522 increases silicide quality associated with transistor 502. After layer 520 is deposited, a layer 532 is deposited on top of layer 520. Layer 532 is deposited by CVD in a separate chamber utilized to deposit layer 520. Layer 532 is preferably a cap layer of silicon oxynitride (SiON) deposited by low temperature plasma enhanced chemical vapor deposition (LTPECVD). Preferably, layer 532 is deposited at a temperature of 400° C.

Figure 23:
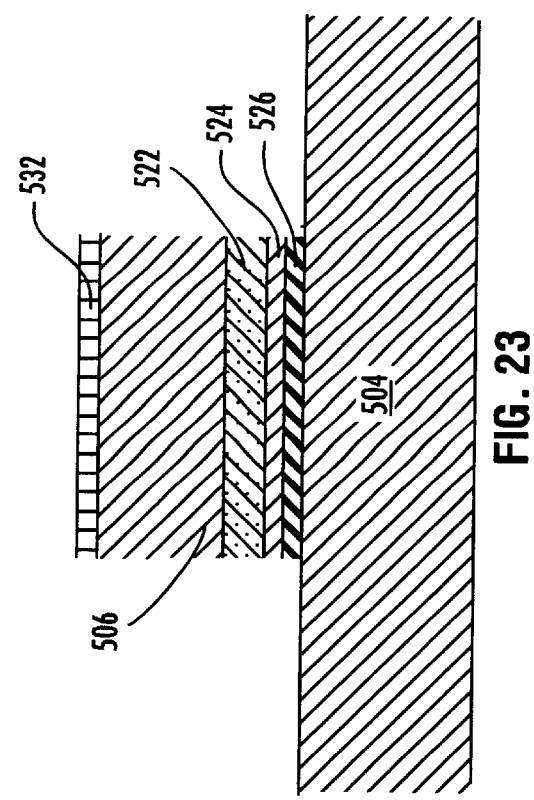
FIG. 23 is a cross-sectional view of the portion illustrated in FIG. 22, showing an etching step to form the gate stack illustrated in FIG. 19.

Layer 532 serves as an antireflective coating for lithography purposes. Layer 532 preferably has a thickness of 100–200 Å. After layer 532 is deposited, layers 532, 520, 522, 524, and 526 are etched to form gate stack 506, as shown in FIG. 23. After stack 506 is formed, layer 532 can be stripped from stack 506 in a conventional etching or removal process.

With reference to FIG. 19, dopants are implanted in gate stack 506 at the time when dopants are implanted into source 508 and drain 510. Source 508 and drain 510 are formed in a self-aligned process. Alternatively, dopants can be provided in separate steps. After dopants are implanted into gate stack 506, a high temperature rapid thermal-annealing process is utilized to diffuse and activate the dopant in gate stack 506, source 508, and drain 510. The rapid thermal annealing reaches a temperature of 1000–1100° C. Layer 520 is transformed into polysilicon during the annealing process. After annealing, conventional CMOS processes can be utilized to form silicide layers 514, 516, and 518, as well as contacts, local interconnects, and other circuit structures.

After annealing, layers 514, 516, and 518 can be formed by depositing via CVD a layer of refractory metal, such as, cobalt, titanium, or nickel, and reacting the refractory metal with exposed silicon above layer 520, source 508, and drain 510. Layers 514, 516, and 518 are preferably 100–200 Å thick and extend about 70% (70 to 140 Å) into the exposed silicon material. After the reaction with the silicon material, the unreacted metal (above spacers 530, etc.) is removed.

Figure 24:
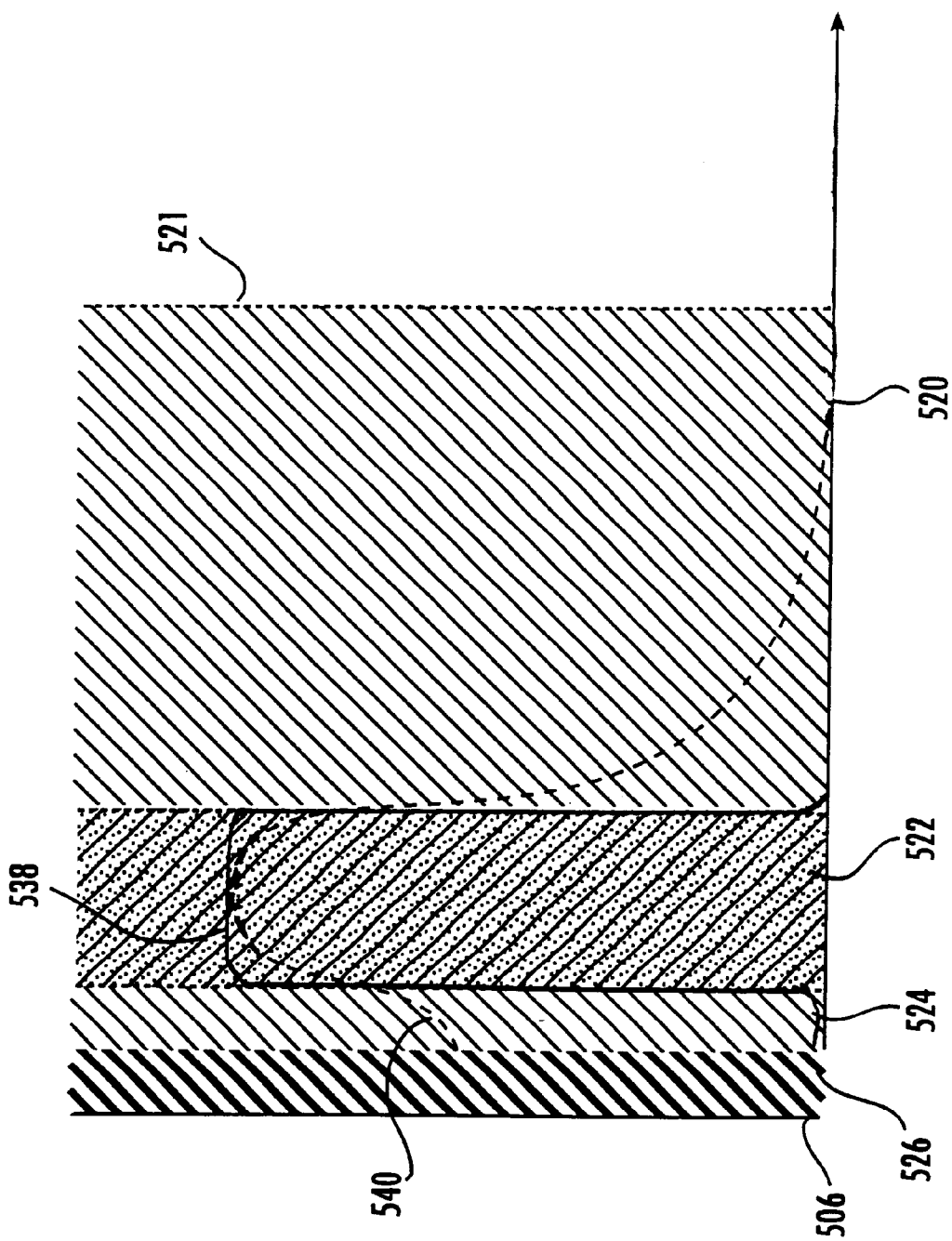
FIG. 24 is a cross-sectional view of the gate stack illustrated in FIG. 23, showing germanium concentration levels.

With reference to FIG. 24, a solid line 538 indicates a concentration of germanium in gate stack 506 before rapid thermal annealing or as deposited. Line 538 indicates that essentially all of the germanium atoms are located in layer 522 before annealing. A dashed line 540 shows a concentration of germanium after rapid thermal annealing. As can be seen in FIG. 24, the germanium in layer 522 diffuses towards layer 524 and into layer 520. Therefore, germanium in layers 524 and 520 is increased after annealing. However, the thickness of layer 520 prevents significant amounts of germanium from reaching a surface 521 so higher quality silicidation for layer 518 (FIG. 19) can be achieved.

It is understood that while the detailed drawings, specific examples, and particular values given provide a preferred exemplary embodiment of the present invention. The preferred exemplary embodiment is for the purpose of illustration only. The method and apparatus of the invention is not limited to the precise details and conditions disclosed. For example, although particular polysilicon gate structures are described, other types can be utilized. Additionally, hybrid processes of the disclosed processes could be utilized to provide a polysilicon/germanium gate conductor. Various changes may be made to the details disclosed, without departing from the spirit of the invention, which is defined by the following claims.

What is claimed is:

1. A gate stack structure above a single crystal substrate, the gate stack structure comprising:
   a gate insulating layer above the single crystal substrate;
   a thin semiconductor seed layer disposed above the gate insulating layer;
   a compound semiconductor layer including germanium disposed above the thin semiconductor seed layer;
   an amorphous semiconductor layer above the compound semiconductor layer; and
   a silicide layer disposed above the amorphous semiconductor layer, the silicide layer being in contact with the amorphous semiconductor layer, the amorphous semiconductor layer being thicker than the compound semiconductor layer.

2. The gate stack structure of claim 1, wherein the seed layer includes polysilicon deposited by low pressure chemical vapor deposition.

3. The gate stack structure of claim 1, wherein the silicide layer includes tungsten.

4. The gate stack structure of claim 1, wherein the gate stack is subjected to a rapid thermal anneal to diffuse germanium throughout the gate stack.

5. The gate stack structure of claim 1, wherein the gate stack is doped with P-type or N-type dopants to increase conductivity.

6. An integrated circuit including a plurality of transistors, the transistors including a gate dielectric, a seed layer disposed above the gate dielectric, a compound semiconductor layer disposed above the seed layer, an amorphous layer above the compound layer, and a silicide layer above the amorphous layer, wherein the compound semiconductor layer includes first semiconductor atoms and second semiconductor atoms, the amorphous layer being thicker than the compound semiconductor layer.

7. The integrated circuit of claim 6, wherein threshold voltages for the transistors are controlled by a concentration of the first semiconductor atoms with respect to the second semiconductor atoms.

8. The integrated circuit of claim 6, wherein
the amorphous layer is a silicon layer.

9. The integrated circuit of claim 8, wherein the first atoms are silicon and the second atoms are germanium.

10. The integrated circuit of claim 8, wherein the transistors further include:
a cap layer disposed above the amorphous layer.

11. The gate stack structure of claim 6, wherein the seed layer is a 20 to 40 Angstrom thick polysilicon layer deposited by low pressure chemical vapor deposition.

12. The integrated circuit of claim 10, wherein the amorphous layer is a silicon layer.

13. A gate stack for an ultra-large scale integrated circuit, the gate stack comprising:

a gate dielectric layer; and a gate conductor above the gate dielectric layer, the gate conductor including a seed layer, an amorphous layer and a compound semiconductor layer, the seed layer being adjacent the compound semiconductor layer, the seed layer being less than 20–40 Å thick, the compound semiconductor layer includes germanium, the amorphous layer is adjacent the compound layer and thicker than the compound semiconductor layer.

14. The gate stack of claim 13 wherein the amorphous layer is at least twice as thick as the compound semiconductor layer.

15. The gate stack of claim 14 wherein the seed layer, the compound semiconductor layer and the amorphous layer include silicon.

16. The gate stack of claim 15 wherein the gate conductor further includes a silicide layer adjacent the amorphous layer.

17. The gate stack of claim 16 further comprising a silicon oxynitride cap layer above the silicide layer.

18. The gate stack of claim 13 wherein the compound semiconductor layer is 200–400 Å thick.

19. The gate stack of claim 16 wherein the silicide layer is 100–200 Å thick.

20. The gate stack of claim 19 wherein the amorphous layer is 500–550 Å thick.

\* \* \* \* \*